United States Patent [19]

Haberland

[11] Patent Number: 4,833,396
[45] Date of Patent: May 23, 1989

[54] LEAD FRAME SHORT TESTER

[75] Inventor: Ernest R. Haberland, Manhattan Beach, Calif.

[73] Assignee: Hughes Aircraft Company, Los Angeles, Calif.

[21] Appl. No.: 177,249

[22] Filed: Apr. 4, 1988

[51] Int. Cl.$^4$ .................. G01R 31/02; G01R 33/00
[52] U.S. Cl. .............................. 324/73 PC; 324/57 Q; 324/158 F; 324/158 P; 324/546
[58] Field of Search ............ 324/59, 529, 538, 73 PC, 324/158 P, 158 F, 546, 547, 57 Q, 529, 520, 537

[56] References Cited

U.S. PATENT DOCUMENTS

| | | | |
|---|---|---|---|
| 3,155,897 | 11/1964 | Rice | 324/529 |
| 3,303,400 | 2/1967 | Allison | 324/529 |
| 3,348,147 | 10/1967 | Erath | 324/158 F |
| 3,719,883 | 3/1973 | Pentecost | 324/538 |
| 4,023,102 | 5/1977 | Barrow et al. | 324/158 F |
| 4,377,782 | 3/1983 | Metcalf et al. | 324/73 PC |

FOREIGN PATENT DOCUMENTS

| | | | |
|---|---|---|---|
| 0138181 | 6/1986 | Japan | 324/158 F |
| 0120067 | 6/1986 | Japan | 324/529 |
| 0692659 | 6/1953 | United Kingdom | 324/529 |

Primary Examiner—Reinhard J. Eisenzopf
Assistant Examiner—W. Burns
Attorney, Agent, or Firm—M. E. Lachman; A. W. Karambelas

[57] ABSTRACT

Disclosed herein is a method and apparatus for performing a non-invasive electronic testing of hybrid circuit packages before components are mounted within the package and connected to the outwardly extending wired leads. The testing process disclosed herein includes passing a pair of adjacent lead wires over an energized test loop or coil that is etched upon a coil board. The coil board is mounted on a mouting plate and the entire assembly is connected to the terminals of a Q-meter. As the circuit package under test is passed over the wire-shaped open loop, those pairs of adjacent wires which are shorted will indicate a low Q. On the other hand, those adjacent wires thatr are not shorted to each other in the package body will indicate a higher Q.

6 Claims, 2 Drawing Sheets

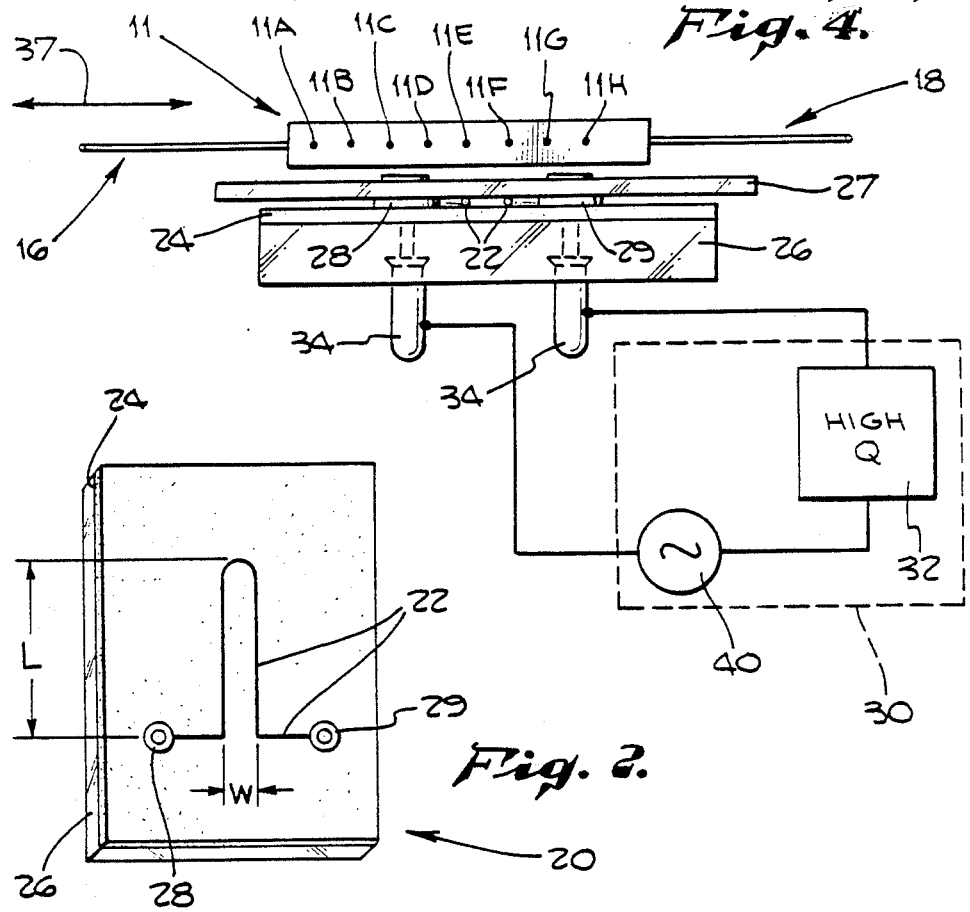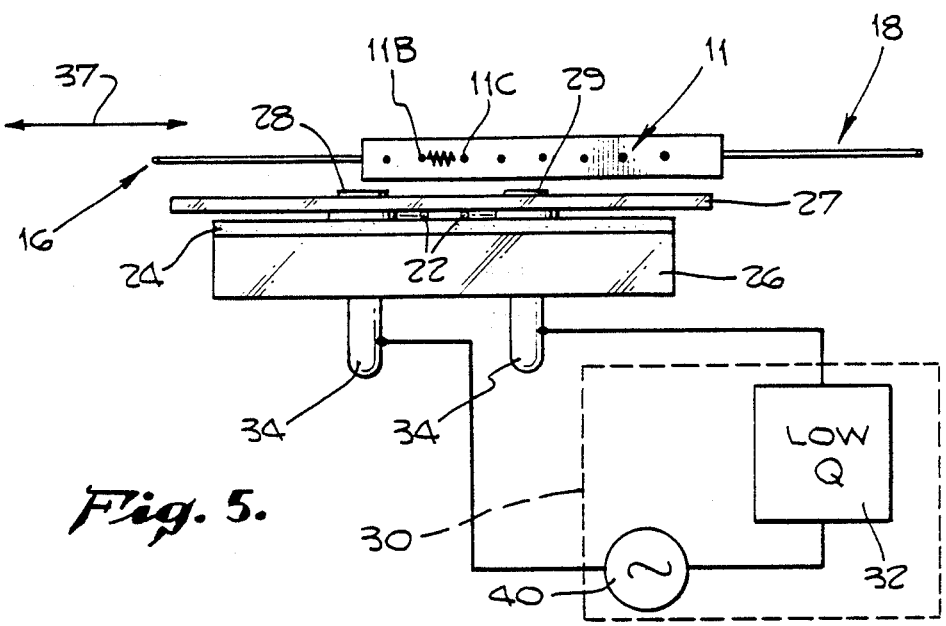

LEAD FRAME SHORT TESTER

BACKGROUND OF THE INVENTION

1. Field of the Invention

The present invention relates generally to the detection of short circuits in electronic lead frames. More particularly, the present invention provides noninvasive detection of short circuits in lead frames prior to installation of circuits therein.

2. Description of Related Art

In addition to modern integrated circuitry, hybrid circuits make up many of today's sophisticated electronic systems. Hybrid circuits are made from a number of discrete components contained within an integrated circuit package. The hybrid circuit may be in a lead frame which comprises small rectangular wires or "leads" extending outward from a central circuit package. Typically, this circuit package may be generally rectangular or square. The leads extend outward from the package in order to connect the components within the package to other circuits and circuit boards.

The individual conductors, or leads, emanating from the inside of the ceramic or plastic package, which is an electrical insulator, are very fragile and subject to damage in the fabrication process. In order to reduce the vulnerability of the leads to damage, the manufacturer connects all the ends of the outside leads together with a heavy frame of the same material as the leads. The heavy frame similar to a picture frame, maintains the mechanical orientation of the leads during the placement of the components in the package. At the completion of the fabrication process, the "picture frame" is cut off and the circuit is ready for test. Prior to cutting off the "picture frame" the package is technically known as a "lead frame."

Traditionally, the practice of manufacturing hybrid circuit packages has proceeded by loading the package chamber with selected components and covering this chamber after the circuity has been wired. This is a long and costly process. Heretofore, this process has often times been in vain, since any defects in the lead frame such as shorts would be detected only after the initial testing of the completed hybrid circuit. In the event that tests of the fully loaded circuit revealed shorts in the lead frame, the package would have to be discarded, resulting in increased costs for the system.

As is apparent, it would be desirable to test for shorts in the lead frame prior to final assembly of the components into a circuit package. However, this has not been possible because the individual lead frame conductors are shorted at their outside extremity by the lead frame structure.

Thus, a need exists in the art for a method of testing unloaded circuit packages, that is, before the discrete components are assembled to form a functioning circuit. Such a test would allow the hybrid circuit manufacturer to identify and discard defective packages before they are loaded. This type of initial screening would substantially reduce the high cost and lost time associated with the existing practice of testing the circuit package after the final circuit is fabricated.

SUMMARY OF THE INVENTION

The subject invention comprises a device for the non-invasive testing of the presence of an electrical short between adjacent conductors of a lead frame. The invention is especially well suited for testing circuit packages prior to the loading of the components into the package.

The invention includes a lead frame tester comprising a signal inducing means made from a conductor formed into a geometric shape which substantially conforms to the shape of the adjacent conductors being tested.

The device comprises an insulated coil board upon which a conductive material is shaped into an open loop. The insulated coil board is generally a thin material and often flexible. Therefore, it is recommended that the coil board be mounted upon a base support plate for rigidity. The open loop of conductive material may be etched onto the coil board and is used to test the insulated circuit package. The open loop forms a pattern which substantially matches the size and shape of at least two adjacent leads extending outward from the package. The loop is as wide as the distance between these two adjacent leads so that when the loop is brought into proximity of two adjacent lead wires which are being tested, the adjacent leads are superimposed and match the conductive material.

This open loop-shaped structure is referred to herein as the "test loop" in order to avoid confusion since the open loop structure, when used in the present invention, is not an electrically open loop when energized.

The conductive material is energized to induce a signal in the adjacent leads under test. The signal is induced in the test loop once the test loop is aligned and physically separated from the two adjacent contact leads being tested. A high frequency signal is passed through the test loop of the coil board and the Q of the test loop is measured at resonant frequency while being electro-magnetically coupled to the loop of the adjacent leads. The test loop and adjacent leads form a coupled system. The Q of this coupled system is high when the leads are not shorted. Should the Q be low, it indicates the presence of adjacent contact leads which are shorted.

In order to prevent physical contact between the test loop and the adjacent contact leads being tested, as the test loop is aligned with the adjacent wires, a thin layer of insulating material, preferably transparent, is placed between the test loop and leads to separate them and prevent physical contact. This thin layer material assures that the test loop is not inadvertently shorted due to physical contact with the leads, resulting in a false test reading. Such a thin layer separation gives rise to capacitive as well as inductive coupling between the test loop and the adjacent conductors of the circuit package.

The test loop of the test circuit is connected to a high frequency power source and both are connected to a Q meter. The test loop forms a self-resonant circuit with the meter indicating high Q. ("Q" or "quality" is defined as inductive reactance ($X_L$) divided by circuit resistance (R)). Where the test loop is coupled to an open circuit pair of adjacent contact wires, the capacitive coupling between unshorted leads and the test loop will not significantly change the Q reading of the meter. In the event that the adjacent contact leads being tested are shorted, this shorted pair of leads coupled to the test loop will cause the Q on the meter to drop dramatically. Accordingly, a short circuit can be easily detected.

This invention further provides a non-invasive method of testing a hybrid circuit package which has a plurality of contact leads extending radially outward from the package. The testing method indicates the presence of a short circuit between adjacent pairs of the contact leads of the package. This method comprises the steps of directly connecting the test loop of a conductive material in series with a source of alternating current and a meter suitable for measuring the Q of the test loop. The test loop is shaped to conform to the length and width of separation between adjacent pairs of contact leads. The test loop may be etched onto the coil board forming a rectangular-shaped conductive pathway. A thin layer of insulating material is placed between the test loop and the leads being tested, so that the test loop is physically separated from the pair of adjacent leads being tested causing the test loop and the adjacent wires of the package to be capacitively and inductively coupled during the test. The adjacent pairs of contact leads under test are passed over the energized test loop. The Q of the test loop will change to indicate the presence of an electrical short or low resistance connection between the pair of adjacent leads under test.

The above features and attendant advantages of the present invention will become apparent as the invention becomes better understood by reference to the following detailed description when considered in conjunction with the accompanying drawings.

BRIEF DESCRIPTION OF THE DRAWINGS

FIG. 2 shows a shaped single turn loop made from conductive material mounted on a coil board.

FIG. 4 shows a front cross-sectional view of operative testing system of this invention, with the test meter 32 shown, in part, as a block diagram.

FIG. 5 shows a view substantially similar to FIG. 4 where the operative testing system of this invention detects a shorted pair of adjacent leads extending from the circuit package.

DETAILED DESCRIPTION OF THE INVENTION

Figure 1:
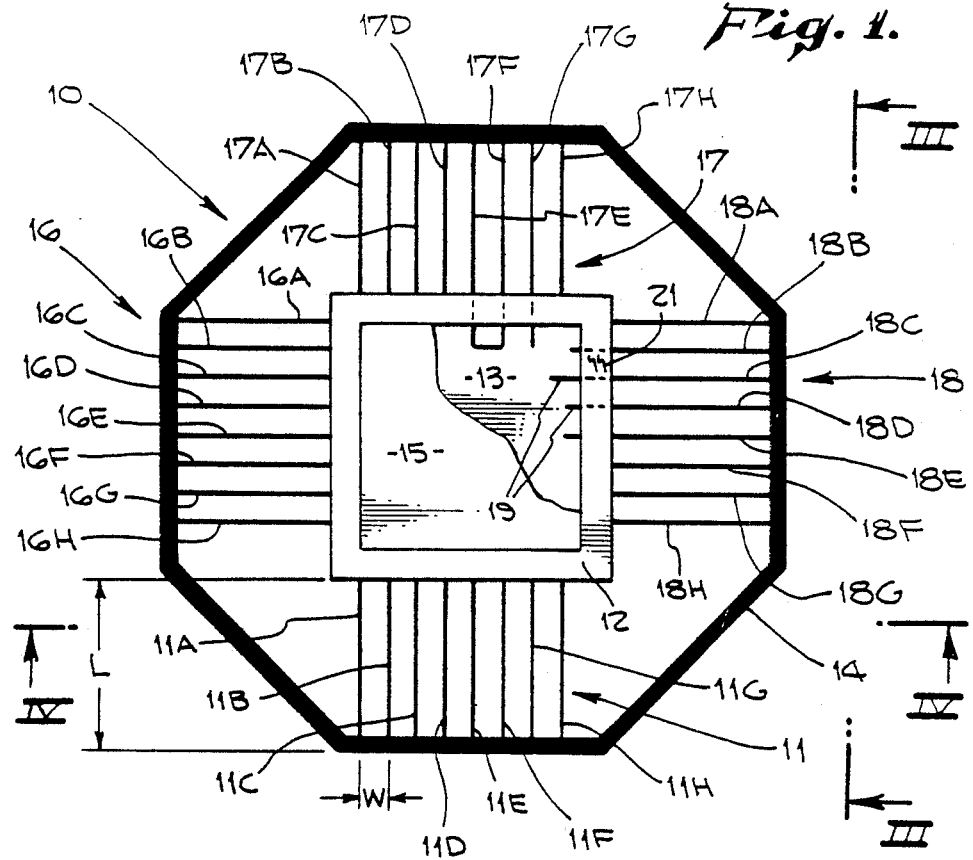
FIG. 1 shows a hybrid circuit package having a plastic outer wall 12 with extending leads to an outer lead frame 14, ready for testing by the system of this invention.

FIG. 1 shows a hybrid circuit package 10 having a plastic or ceramic body 12 which is surrounded by an outer conducting frame 14. Leads such as 11, 16, 17, and 18 extend outward from the package body 12 in all directions to the outer frame 14. The outer frame 14 serves to support and protect the leads (11A-H, 16A-H, 17A-H, and 18A-H) until the hybrid circuit has been fully mounted within the sealed package surface 15 surrounded by body 12. If one were to break away the hermetically sealed package surface 15, exposing the component supporting chamber 13, leads, such as 18C and 18D are shown as penetrating the outer wall 12, forming pins such as 19. The pins 19 are normally used to connect with the discrete components resident within the chamber 13. Some leads may be inadvertently connected or crossed, as is the case with leads 17E and 17F. Other leads, such as 18B and 18C may be physically separated, but shorted because of the presence of conductive impurities 21 in the body wall 12. These impurities 21 may give rise, for example, to a short circuit between leads 18B and 18C.

An entire hybrid circuit is constructed within the confines of the peripheral body 12. A determination that the circuit package 10 is free from defects could heretofore, only be made upon completion of the wiring of the entire component system housed within the chamber 13.

The outward extending contact leads, such as 11, 16, 17 or 18 are securely supported by the conductive outer frame 14, which is later clipped from the leads, after the hybrid circuit components are full loaded into the package chamber 13. The outer frame 14 is necessary to support the external hybrid circuit leads 11, 16, 17 and 18 during shipping and prior to manufacture because the leads are very fragile.

Very few shorts are the result of crossed wires such as 17E and 17F, and may be easily detected visually. Typically, shorts develop through impurities in the package wall 12 between adjacent leads. The task of locating impurities and shorts in the body wall of a package 12 cannot be accomplished by visual observation. A circuit package 10, before its inner chamber 13 is loaded with components and covered by a sealed package surface 15, may have a full set of leads which appear to be properly insulated.

To the visual observer, such a package is in good condition. However, the circuit package may be made from materials such as plastic resins or ceramics, which may be poorly processed, allowing electrically conductive impurities to be inadvertently introduced into the package body. For example, a plastic package may be made from epoxy, which is injected in a mold to manufacture the final package body into which discrete components are mounted. Resins are manufactured using metal machinery which rubs and grinds, and can generate metallic shards. Some of this metallic material from the machine or other recycled components may be inadvertently introduced into the packaging in a manner in which the conductive impurity remains hidden from ordinary observation at the time the insulated package is used to form the hybrid circuit.

Figure 3:
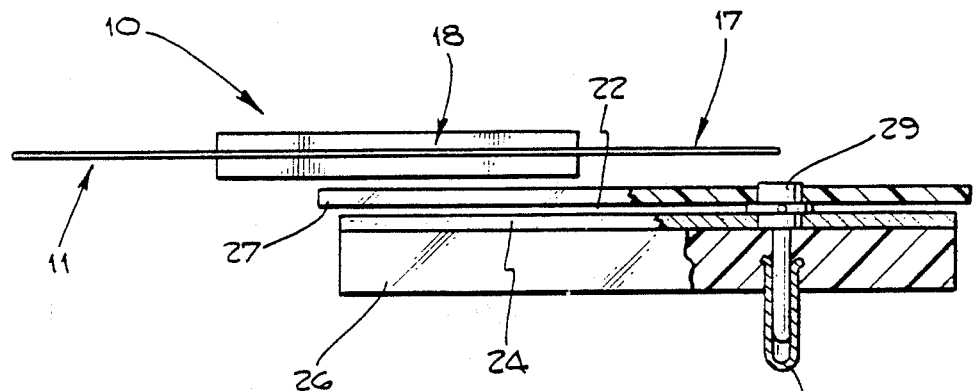
FIG. 3 is a side-elevational view of the preferred embodiment operative testing system of this invention.

With reference to FIGS. 2 and 3, a testing device assembly 20 is shown which comprises a coil board 24 mounted on a base support plate 26. The coil board 24 may be a thin insulated copper clad board mounted on a Plexiglas support plate 26. Etched on the surface of the coil board 24 is a test loop 22. In the preferred embodiment, the test loop 22 is energized through a pair of terminals 28 and 29, which terminals may be male banana-type plugs. The male plugs 28 and 29 recede downward into the assembly 20 and protrude through the underside of the Plexiglas plate 26 in order that the assembly 20 may be mounted on the forward surface of the Q-meter 30 (see, FIG. 4). It will be noted that in the preferred embodiment, the length of the test Loop (L) matches the length (L) of each of a pair of adjacent leads, as shown on FIG. 1. Likewise, the width W between the two legs of the test loop 22 is the same as the width (W) between adjacent leads of the circuit package found within the wall 12 of FIG. 1.

With particular reference to FIGS. 3 and 4, an operational assembly of the system for testing for the presence of an electrical short between adjacent contact leads of an insulated circuit package 10 is shown in side elevational view. The test assembly 20 is shown mounted on a Q-meter 30, which (in the preferred embodiment) may be an HP 4342A Q-meter (manufactured by Hewlett Packard). As can be seen from FIG. 3, lower protruding portions of the male terminal 29 are mounted into female contact posts 34, which are part of the Q-meter 30. One of which posts is shown. The assembly 20 extends forward from the terminals 28 and 29. The Q-meter has an internal tunable RF oscillator 40. The oscillator 40 energizes the test loop 22. The electromagnetic field radiated from the test loop functions as a signal inducing means.

With reference again to FIG. 3, before the testing of the circuit package 10 may begin, a thin sheet 27 (0.002 inch thick) of a flexible transparent insulating material (MYLAR) should be overlayed and placed to cover the test loop 22. The purpose of this thin layer 27 material is to prevent inadvertent physical contact between the test loop 22 and a pair of adjacent leads of the circuit package 10 being tested.

With the test assembly 20 extending forward over one end from the Q-meter 30, the circuit package 10 may be linearly displaced along an axis 37 as shown in FIG. 4. The package 10 may be moved in increments of a distance equal to the width (W) of the test loop 22. As the circuit 10 is displaced along the axis 37, one quadrant of lead wires (11A–11H of FIG. 4) is passed over the test loop 22. As each pair of adjacent wires is measured, the Q-meter registers a relatively high (HIGH Q) or low (LOW Q) reading as displayed at 32 (FIGS. 4 and 5). In this manner, by linearly displacing one quadrant (such as 11A–11H of FIG. 1) one at a time over the test loop 22 an entire test of each quadrant 11, 16, 17 and 18 of the circuit package 10 may be made to determine the existence of shorts between contact leads of the circuit package 10. This testing is done before discrete components are mounted within the package chamber 13 (FIG. 1).

FIGS. 4 and 5 illustrate the manner of operation of the electrical short testing system of this invention. The AC generator 40 and a Q-meter display 32 are connected to each other and the test loop or coil 22. The Q-meter is tuned to the self-resonance of the test loop (or coil) which is approximately 30 megahertz. This frequency is determined by tuning for a peak Q value of about 40. When the test loop is in good alignment with a pair of package leads, such as 11E and 11F passing through the body and not shorted, the self-resonance frequency of the test loop will be reduced. This phenomena is caused by the distributed capacitance between leads 11E and 11F and will be inductively coupled as shunt capacitance across the test loop or coil. The Q-meter will have to be repeaked by dropping its frequency slightly. The new Q value will be about 36.

Should the two coupled leads 11B and 11C be shorted, there is a one turn closed coil consisting of the two parallel leads shorted on one end by the lead frame and the short in the body of the package on the other end. The closed one turn coil is shorted and coupled to the test loop which will demand more power from the Q-meter generator. The Q-meter will respond to the increase in power as the test loop or coil exhibits loss and indicates a substantially lower Q reading of 22 to 26.

Thus, this dramatic change in Q or selectivity, indicated on the display 32 of the Q-meter 30, is a clear demonstration of a non-invasive method of testing adjacent leads of a circuit package before the components are placed within the package.

It will be noted that the method and apparatus of this invention is primarily useful for locating and identifying shorts of low resistance. Through experimentation, it has been determined that the test loop or coil will give a substantial signal up to a 45 Ohm short. At 70 Ohms, there is a good possibility that a short would not be detected by this system.

While a preferred embodiment of the subject invention has been shown, alternative embodiments may be made which are essentially equivalent to the invention disclosed and claimed herein. For example, although ideally the length and width of the test loop or coil 22 should be identical to a pair of adjacent wires being tested, the method of testing circuit packages for shorts and the apparatus disclosed herein would also work where the test loop 22 was a slightly different shape or size. Where the shape or size of the test loop 22 is not substantially identical to a pair of adjacent wires, the drop in Q normally indicated on the Q-meter may not be as dramatic. This alternatively configured loop could serve to provide a non invasive test, just as the method and apparatus taught by the preferred embodiment disclosed herein. Therefore, the appended claims should be construed broadly to encompass not only the embodiments disclosed but additional alternative equivalent embodiments intended to be within the scope of this invention.

What is claimed is:

1. A lead frame short tester, for testing for the presence of electrical shorts between adjacent leads of a lead frame, said adjacent leads defining an adjacent lead configuration, said tester comprising:
  (a) a coil, operative to be inductively coupled to said adjacent leads, said coil having a size and shape which substantially matches said adjacent lead configuration;
  (b) a signal source for energizing said coil; and
  (c) means for measuring the Q value of said coil to test for the presence of electrical shorts between said adjacent leads.

2. A device for testing for the presence of electrical shorts between adjacent contact leads which are integral to and extend outward from a circuit package, comprising:
  (a) a base support plates;
  (b) a coil board mounted on said support plate;
  (c) a single-turn, open-ended coil of conductive material having a size and shape which substantially match the size and shape of two adjacent leads extending outward from said circuit package;
  (d) an insulating layer between said coil and said adjacent leads;
  (e) means for energizing at selected frequencies said open-ended coil, while said coil is aligned with and superimposed over said two adjacent contact leads to thereby inductively couple said coil to said adjacent leads;
  (f) means for measuring the Q value of said coil, whereby said Q value of said coil is substantially reduced when said adjacent contact leads are shorted.

3. The device of claim 2, wherein said means for energizing said coil comprises:
  an AC generator connected to said coil to provide a driving coil, which radiates a magnetic field;
  whereby, said shorted contact leads affect the Q value of said driving coil.

4. The device of claim 3, wherein:
  a Q-meter is connected to said driving coil and AC generator, whereby, the change in the Q value of said driving coil as it is inductively coupled to said adjacent contact leads may be measured.

5. A non-invasive method of testing a circuit package, having a plurality of spaced contact leads extending radially outward from said package, for the presence of a short circuit between adjacent pairs of said contact leads, comprising the steps of:

energizing a test loop of a conductive material, and measuring said test loop Q by suitable measuring means;

said test loop being shaped to conform to the length and width of separation between said adjacent pairs of leads and said test loop being physically separated from said pair of adjacent leads of said circuit package; and passing said pair of adjacent leads of said circuit package over said test loop;

whereby, the Q of said test loop will change to indicate the presence of an electrical short in said package.

6. A system for testing hybrid circuit package contact leads to determine whether adjacent leads are shorted, comprising:

a test loop of conductive material formed on a thin coil board, said test loop having dimensions substantially the same as said adjacent leads under test;

said coil board mounted upon a base support plate;

a test meter for determining the Q of a circuit, connected with an AC generator;

said Q meter having supporting electrical terminals extending outward from said meter, said terminals being suitable for receiving said coil board mounted on said support plate;

a protective insulating material placed over said coil board and test loop, so that as a circuit package is passed over said test loop, no contact occurs between said leads of the package and said test loop;

whereby, the test meter indicates a change in circuit Q when the test loop couples to a shorted pair of leads in the lead frame.

* * * * *